United States Patent [19]

Drury

[11] Patent Number: 5,145,717
[45] Date of Patent: Sep. 8, 1992

[54] STRIPPING METHOD FOR REMOVING RESIST FROM A PRINTED CIRCUIT BOARD

[75] Inventor: Robert F. Drury, East Windsor, N.J.

[73] Assignee: E. I. Du Pont de Nemours and Company, Wilmington, Del.

[21] Appl. No.: 541,009

[22] Filed: Jun. 20, 1990

Related U.S. Application Data

[63] Continuation-in-part of Ser. No. 472,996, Jan. 31, 1990, abandoned.

[51] Int. Cl.$^5$ .............................................. C23C 26/00
[52] U.S. Cl. ...................................... 427/96; 427/54.1; 427/271; 430/329; 430/313
[58] Field of Search ................ 427/96, 54.1, 271; 430/329, 313

[56] References Cited

U.S. PATENT DOCUMENTS

| | | | |
|---|---|---|---|
| 3,930,857 | 1/1976 | Bendz | 427/96 |
| 4,302,530 | 11/1981 | Zemel | 427/96 |
| 4,458,617 | 10/1985 | Miyatani et al. | 51/293 |
| 4,698,294 | 10/1987 | Lau | 156/241 |
| 4,711,835 | 12/1987 | Dufour | 427/96 |
| 4,731,125 | 3/1988 | Carr | 134/17 |
| 4,759,774 | 7/1988 | Hochberg et al. | 51/293 |
| 4,912,020 | 3/1990 | King | 427/96 |
| 4,983,252 | 1/1991 | Masui | 427/96 |

FOREIGN PATENT DOCUMENTS

| | | | |
|---|---|---|---|
| 2722557 | 12/1977 | Fed. Rep. of Germany | 427/96 |
| 225092 | 10/1986 | Japan | 427/96 |
| 120090 | 5/1989 | Japan | 427/96 |

*Primary Examiner*—Shrive Beck
*Assistant Examiner*—Vi Duong Dang

[57] ABSTRACT

A stripping method is provided to remove processed photoresist images from printed circuit substrates without damage to underlying high density circuitry. A solid particulate blast process is used to remove the resist images wherein the polymeric particles having a Mho hardness in the range from 2.0 to 4.0 are used as the blast media.

20 Claims, No Drawings

STRIPPING METHOD FOR REMOVING RESIST FROM A PRINTED CIRCUIT BOARD

RELATED APPLICATION

The present application is a continuation-in-part of Ser. No. 472,996 filed Jan. 31, 1990, abandoned Aug. 31, 1990.

BACKGROUND OF THE INVENTION

The present invention is directed to the manufacture of printed circuit boards using a plating, etching or permanent resist material. More specifically, the present invention is directed to removal of used resist subsequent to plating and/or etching operations.

In the manufacture of printed circuit boards, a temporary polymeric resist image is formed on a substrate, e.g., a copper clad fiberglass epoxy laminate which exhibits uncovered surface areas not protected by the resist image that are modified by either removal with an etchant or by depositing an additional material through plating. After the surface areas are modified, the resist image is typically removed before subsequent steps are preformed to produce a printed circuit board. Removal of the resist image is facilitated by use of liquids and vapors which are typically organic solvents, aqueous alkaline solutions or combinations thereof. Such liquids are chosen so that the substrate material and the overlying circuit lines are left substantially unaffected by the liquid treatment and are left substantially residue free. Circuit line density on printed circuit boards may be greater than 0.010 inch wide circuit lines and spaces or as small as about 0.002 inch wide circuit lines and spaces. Frequently circuit density will vary substantially from one area of a circuit board to another. As circuit density becomes greater, resist removal becomes more difficult requiring longer chemical exposure time and additional controlled conditions to satisfactorily produce fine line circuitry. Since the liquids and vapors used to remove the resist frequently are vigorous organic solvents and/or caustic solutions, added safety measures are required to carry out this operation. Safe environmental disposal of spent waste liquids add further concern. The production of printed circuit boards using a variety of resists is described in "Printed Circuits Handbook" edited by Clyde F. Coombs, Second Edition, published by McGraw-Hill, Inc., 1979. In particular, pages 8-9 through 8-11 discuss resist removal in detail. The present invention eliminates the need of liquid/vapors for resist removal. It renders a much simpler, less costly and more environmentally safe method of resist removal.

Accordingly, sand blasting and grit blasting with inorganic media has been used to abrasively remove paint and other adherent materials for cleaning underlying surfaces. Sand and grit blasting, for delicate substrates such as airplane skins and composites, is too vigorous for practical use. Therefore, organic media grit has been used instead for periodic paint removal. U.S. Pat. No. 4,731,125 discloses a soft media blast paint removal system which utilizes granular plastic media for blast cleaning paint from composite surfaces without rendering damage to the surface. The media disclosed in the above-referenced patent have a Moh hardness in the range of 2.5 to 3.5 and a U.S. standard sieve sizes ranging from 12-16 to 60-80. In this system the plastic media is propelled to give a media flow of about 40 p.s.i. and the media flow path will be one in which the angle and direction of the flow produces highly efficient removal of adherent material from the surface without damaging the composite. Typically, the media flow is angled away from a perpendicular direction with respect to the target surface so that the leading edge of the coating is exposed to the media flow. Likewise, U.S. Pat. No. 4,759,774 discloses a filled polymeric blast media for similar use.

Polymeric resin abrasives have been used in blasting operations to remove flash from molded encapsulants of electronic circuit components, such as: resistor, capacitor, semiconductor and the like. U.S. Pat. No. 4,548,617 discloses synthetic resin, abrasive particles each having a plurality of cutting edges and cracks for cleavage upon impact. The resin particles are used as blast media for flash removal from plastic encapsulated semiconductor packages on lead frames without damaging the molded product. The patented invention discloses the hardness of the resin media which is equal or close to that of the encapsulant is optimal, and the average particle size is preferably within the range of 0.05 to 2.0 mm.

A need exists in the printed circuit industry to simplify and shorten the resist removal process without damaging the delicate printed circuit lines or the underlying substrate material. The demand extends to a process which yields an environmentally safe waste, one without caustic liquids intermingled with spent resist; waste which could be disposed of in an ordinary landfill.

SUMMARY OF THE INVENTION

The present invention provides a method of resist removal from a processed printed circuit substrate comprising the steps of:

a) forming a resist image on a substrate, whereby portions of the substrate on its surface are protected by the resist, b) modifying the substrate unprotected by the resist image by removing material from the substrate or depositing material on the surface of the substrate in formation of a processed printed circuit substrate, and c) removing the resist by projecting media particles having a Moh hardness in a range from 2.0 to 4.0 onto substrate to uncover unmodified substrate areas.

A printed circuit substrate may be a copper clad laminate, exhibiting: 1. unprotected copper areas which are removed by etching to directly form conductive electrical circuitry separated by dielectric laminate areas or, 2. the unprotected copper areas may be plated with added copper or other protective metals to form conductive electrical circuitry traces separated by the resist image. In the second instance the electrical circuitry is formed by removing the resist image and etching the uncovered copper surface to form plated electrical circuitry separated by dielectric laminate areas.

DETAILED DESCRIPTION OF THE INVENTION

The present invention is specifically directed to media blast removal, or stripping, of adherent resist material from a printed circuit substrate during the manufacture of printed circuit boards. In the present context a circuit board substrate means a substrate with a surface containing conductive electrical circuitry separated by dielectric areas.

The general use of resists to prepare printed circuit boards is described in "Printed Circuits Handbook", supra, which includes both screen printed resists as well as dry film resists known as photoresists. Accordingly, the use of conventional photoresists for preparing printed circuits is described in "Photoresist—Materials And Processes", by W. S. DeForest, published by McGraw-Hill, Inc., 1975, this publication which includes negative working photopolymerizable and photocrosslinkable or dimerizable systems as well as positive working photosolubilizable systems. Photoresists may be used as a temporary coating in a primary imaging process to make the printed circuit or they may be used in a secondary imaging process to make permanent coatings, such as a solder mask, which protects the circuit from subsequent processing or from environmental effects. Permanent coatings also are used as intermediate insulative layers in the manufacture of multilayer printed circuits.

In practice, a photopolymerizable layer, typically between 2.5 and 125 micrometers thick, is applied to a printed circuit substrate, e.g., a copper clad fiberglass epoxy board, for primary imaging or a printed circuit relief pattern on the board for secondary imaging. Depending on the ultimate use of the completed printed circuit, a variety of copper clad substrates may be used including the conventional rigid substrate materials fiberglass epoxy laminates, phenolic paper laminates, polyimide epoxy composites, and fluoropolymer composites, as well as copper clad flexible substrates, such as polyimide and polyester films. If the printed circuit is to be prepared by additive plating, the substrate material is unclad but may contain a plating catalyst. The applied photopolymerizable layer is then imagewise exposed to actinic radiation to harden or insolubilize exposed areas. The unexposed areas are then completely removed typically with a developer solution which selectively dissolves, strips or otherwise disperses the unexposed areas without adversely affecting the integrity or adhesion of the exposed areas. The surface areas of the substrate which were uncovered by the development process are then modified by removing material therefrom (etching) or depositing a material thereon.

In the instance of primary imaging to form a printed circuit board, the uncovered copper surface areas may be etched or removed to form a printed circuit directly, or additional copper or other metal resistant to etchant, e.g., gold, tin/lead, etc., may be plated thereover. In the first instance, the hardened exposed resist is typically removed with an organic solvent, an aqueous solution or combinations thereof from the remaining copper surface by a stripping process to form the circuit board directly. It is crucial to remove all hardened resist from the copper surface to insure good electrical connection during subsequent operations such as soldering of electrical components. In the second instance, the hardened resist is first stripped from the unplated copper surface which is then etched or removed from the substrate to form a plated printed circuit board. Again, it is crucial that all hardened resist is removed from the copper surface to insure that the underlying substrate copper is completely etched away. If etching is incomplete and a residue remains, a short between adjacent circuit lines may occur. Removal of hardened resist is particularly crucial in high density circuitry. High density circuitry typically includes circuit densities ranging from 0.006 inch (0.152 mm) to 0.002 inch (0.051 mm) or less lines and spaces.

Continuing on, when a permanent resist or solder mask is formed on a printed circuit board, the developed solder mask resist image may first be treated to further cure or harden it by baking at elevated temperatures, by additional uniform exposure to actinic radiation or a combination thereof to produce a circuit board having a cured soldermask layer covering all areas except pad or through-hole areas. Electrical components are then inserted into the through-holes and soldered in place to form the packaged electrical component. In the instance when a multilayer printed circuit is to be prepared, a permanent resist may be applied to a catalyzed substrate, imaged, developed to uncover catalyzed areas then typically electrolessly plated to form a first circuit layer. The entire surface of the first circuit layer is then catalyzed and the process is repeated one or more times to form a multilayer printed circuit board. Furthermore, when a permanent coating is applied out of register with the underlying circuit or is otherwise flawed the coating must be removed before final hardening in order to recycle the printed circuit board. In other words, the permanent coating must be completely removed without damaging either the underlying circuitry or the substrate material.

In a preferred mode the permanent coating is applied before final hardening takes place such as by baking. However it is within the scope of the present invention that removal of a permanent hardened coating takes place by the technique disclosed herein. However care must be taken to obtain unchanged or substantially unchanged underlying circuitry or substrate material particularly if electronic components are present.

The present invention is directed to a process which provides an instantaneous way to remove or strip hardened resist images from printed circuit substrates without generating substantial amounts of objectionable waste. The process is particularly useful in stripping exposed photoresists from high density plate-and-etch printed circuit boards without damaging the 0.002 to 0.001 inch circuit lines or their adhesion to the underlying substrate material. The process may also be used to remove defective permanent coatings such as solder masks without damaging either the underlying circuitry or substrate material. Both instances result in substantially no added cleaning operations before continuing normal circuit board processing.

Steps in the dry stripping of photoresists include the provision of a granular media substantially composed of solid media particles of a polymeric or resin material which has a Moh scale hardness number lower than about 4.0. The media is then accelerated using conventional media propelling means to produce a substantially continuous media flow at a media outlet having an equivalent pressure of approximately 60 pounds per square inch or less in the projected media flow when the media is pneumatically propelled. The media flow is projected onto the surface of the printed circuit substrate possessing the photoresist image. Thus, adherent photoresist is removed from the circuit board surface without damage to either the circuitry or the board surface. The media may be projected in a dry state or in a wet state in the presence of a liquid.

STRIPPING MEDIA

It has been discovered that the most effective media for use in removing exposed photoresist and which avoids surface damage when properly applied, are media particles, preferably solid (as opposed to, e.g., hollow spheres) and particularly polymeric particles, with very specific properties. The media particles are preferably composed of a polymeric or resin material having a Moh scale hardness number of about 2 to 4. For the purpose of this invention the term "polymer" is intended to include natural and synthetic polymers, interpolymers, and resins. Suitable media of this type includes thermoplastic and thermoset acrylic polymers and interpolymers, polyesters, polyamides, polycarbonates, polystyrenes, thermoset urea formaldehyde polymers, melamine formaldehyde polymer, and the like. Such polymeric materials can be readily formed into granular particles. A particularly preferred media is thermoplastic plastic, such as acrylics. In addition to having the correct hardness, spent thermoplastic media can be recycled and formed into new products. A Moh hardness of 4 is substantially soft compared to other blast media, such as sand, which has a Moh hardness of 7. It is theorized that the relative softness of the media in combination with the application method described below prevents circuit board damage. Examples of suitable commercially available blast media which can be used in the present invention are SOLIDSTRIP ® Plastic Abrasives manufactured by E. I. du Pont de Nemours and Co., Wilmington, Del. and Polyextra ® Blast Cleaning Media, manufactured by the U.S. Plastic and Chemical Corporation. Other candidates for solid media particles are inorganic or organic compounds which include natural products, such as ground walnut shells, corn cobs, rice hulls, etc., may be used in the method of this invention provided Moh hardness criteria is met. However, in the use of such agrimedia added measures are needed to deal with concomitant dust problems as well as oily residue left on the substrate surfaces.

Blast media are generally classified by particle size dictated by U.S. standard sieve sizes. U.S. standard sieve sizes 12, 40, 60, 80, and 200 correspond to an average particle diameter in millimeters of 1.70, 0.425, 0.250, 0.180 and 0.075 respectively. Depending on the particular resist removal operation, a wide range of media particle sizes may be used ranging from a sieve size of about 12 to 200. For optimum results in removing resist from high density circuitry, a sieve size of 60-80 or greater is preferred.

The next aspect of this invention to consider is the acceleration of the media which is effective for blast removal of photoresist. Acceleration can be accomplished by any suitable media propelling or projecting means. The media may be propelled or projected in a gaseous or liquid fluid such as air or water or it may be projected by some other mechanical means. Typically, pressurized air is used to accelerate and direct the media using a pneumatic sand blaster, or similar device. The media may also be accelerated as a water slurry or dispersion and projected as a stream onto the circuit board surface or the media particles may be injected into a projected water stream. Alternatively, an airless centrifugal propelling means may be employed. Although the use of water to project the media particles does not have all of the advantages of the completely dry method of air or airless projecting means, water propulsion has compensating advantages such as the use of very small media particle sizes without the potential explosive hazards or static induced media build-up on the circuit board. Typically, the media propelling means will have a moveable media outlet, such as a nozzle, which allows the media flow to be directed over the entire circuit board surface to be stripped. The circuit board may be moved past one or more fixed nozzles, through the utilization of a conveyor or moveable stage. The media propelling means should produce a media flow equivalent to pneumatically propelled media flow of about 15 to 60 pounds per square inch (p.s.i.). Conventional abrasive plastic blasters, which typically operate at pressures of about 25 to 40 p.s.i., can often be modified to output media at 15 or 60 p.s.i. by simple adjustment, or, in some cases, by addition of a pressure regulator. The optimal pressure for any specific stripping operation will depend on the softness of the media particles, the distance and orientation between the nozzle and circuit board, as well as the rate at which the media flow is swept over the circuit board surface. However, added precautions should be taken with high pressures when large media particle sizes used, since such conditions tend to distort or move high density printed circuit lines. A preferred range of output pressure for removing photoresist from high density printed circuitry with thermoplastic acrylic media is about 15 to 30 p.s.i.

In addition to the type of media and the media pressure flow, a proper configuration of media flow relative to the printed circuit substrate is necessary to completely remove photoresist without damaging or distorting the circuitry or substrate surface of the board. As media flow leaves the nozzle, it is projected as a cone with the nozzle at the apex and the circuit board substrate at the base. By changing the distance between the circuit board and nozzle, the actual media flow pressure projecting onto the circuit board surface may be adjusted to more closely suit the particular circuit surface being stripped. Typically nozzle to board distances are about 6 inches to about 24 inches, but they vary broadly depending on the nozzle, projecting means design, and media type. The orientation of the path of the media flow can markedly affect the extent of photoresist removal without printed circuit damage. An optimal path of media flow will be one in which the angle and direction of the media flow produces highly efficient resist removal from between circuit lines without damage to either the circuit lines or the substrate material. While media flow angled away from a perpendicular direction with respect to the circuit board surface, i.e., 15 to 90 degrees from the plane of the printed circuit board, is useful in removing photoresist, particularly from low density circuitry, a low angle under some conditions, e.g., high media flow pressure, may move or otherwise distort circuit lines. Likewise it is difficult to remove photoresist from between high density circuitry using a single low angle media flow. Complete photoresist removal from high and low density circuitry has been accomplished by angling the media flow to near perpendicular to the circuit board surface, i.e., between about 80 to about 90 degrees from the plane of the printed circuit. Instead of media flow from a single nozzle, nozzles may be ganged at lower angles in a circumference around the circuit board target area to achieve similar results.

Surprisingly, complete removal of photoresist from high density circuitry is achieved even though the media particles are substantially larger than the circuit lines or the resist filled spaces therebetween. Without being bound by any particular theory, the projected media particles are fracturing the resist material from the deep recesses of the circuit lines with clean separation as pieces from both the lines as well as the underlying circuit board surface. This process of resist removal is in contrast to prior art blast paint removal methods wherein polymeric abrasive media cuts or wears away films of paint.

To further illustrate the present invention the following examples are provided.

EXAMPLE 1

Circuit boards were prepared via the conventional process of laminating dry film resists, i.e., Riston ® Photopolymer Resist films (marketed by E. I. du Pont de Nemours and Co., Wilmington, Del.) to copper clad, fiberglass epoxy G-10 laminates, exposing to UV light in a pattern defined by a phototool, washing out the unexposed areas with either 1% aqueous sodium carbonate for the Riston ® aqueous film Types 3100, 3115, 3615, 4115, 4215, and 4615 or 1,1,1 trichloroethane for the Riston ® solvent film Types 1015 and 1215, and either etching the uncovered copper foil to defined circuitry or plating first additional copper on the uncovered copper foil areas and then tin/lead alloy (solder). The patterns used were such as to provide a variety of circuitry, from very high density areas of 0.020–0.150 mm lines/spaces to broad ground planes on the etched panels and similar fine lines and circuit features on the plated panels.

The above circuit boards were subjected to media blasting using an apparatus consisting of a hopper with a valve to feed solid media at a controlled rate into a stream of compressed air. The airstream was then directed through a hose and nozzle over the circuit boards at angles varying from about 30 degrees to about 90 degrees, distances from the target, and blast pressures. The blast media consisted of ground polymethyl methacrylate (PMMA) with an antistat coating, in the size range of 30–40 mesh marketed by E. I. du Pont de Nemours and Co. as SolidStrip ® Type 30L Plastic Abrasive. All films at all exposures were rapidly and completely removed from the circuit boards at blast pressures greater than 15 p.s.i. (measured in the media flow in the outlet tube) and distances less than 24 inches with this media. At blast pressures of 30 p.s.i. or greater, some damage and distortion of the circuit lines less than 0.075 mm on the etched samples was seen as well as attack on the epoxy substrate. Below 30 p.s.i., lines of 0.050 mm or greater were undamaged, and no attack on the epoxy substrate was seen. On the plated samples more time, or higher pressures, or closer approach to the sample was required to remove resist from between closely spaced lines, and with this media some residues of resist were seen with line spacings of less than 0.125 mm. The solder plating was somewhat textured under microscopic examination, but no removal or abrasion was seen. Since, in subsequent processing, the solder coating will either be melted and reflowed or stripped off, this texturing has no functional significance.

EXAMPLE 2

Boards prepared as in Example 1 were subjected to blasting with media in the size range of 40–60 mesh at a media flow angle between about 80 and about 90 degrees. In this case 30 p.s.i. or less blast pressures could be used before onset of fine line and epoxy damage on the etched panels, and 0.080 mm spacing between lines on the plated panels could be completely cleared of resist. Etched panels stripped with this process were subjected to electroless tin deposition, a process which is sensitive to surface contamination. Smooth tin coatings were obtained without voids or coating interruptions, indicating that the surface was free of contamination. Plated panels stripped in this manner were subjected to etching in ammoniacal cupric chloride to remove those parts of the copper foil not plated with solder. No residual copper was seen in the areas which had been covered with resist, again indicating clean stripping.

EXAMPLE 3

Boards prepared as in Example 1 were subjected to blasting with media in the size range of 60–80 mesh. In this case 40 p.s.i. or less blast pressures could be used before onset of fine line and epoxy damage on the etched panels, and lines of 0.050 mm spacing on the plated panels could be completely cleared of resist.

EXAMPLE 4

Boards prepared as in Example 1 were subjected to blasting with media in the size range of 200–250 mesh, consisting of spherical PMMA beads. Pressures of 60 p.s.i. were required to get acceptable rates of resist removal. Etched panels could be stripped without damage of even 0.020 mm lines. However, plated panels were only slowly stripped, and this media, under these conditions, appeared ineffective in removing resist from between fine lines, even though the size range was such that the particles could penetrate between the lines.

EXAMPLE 5

Boards were prepared consisting entirely of a fine-line pattern of 0.075 mm lines/spaces. These boards were plated in such a manner that the plated metal lines extended above the resist lines and mushroomed out to partially cover the edges of the resist lines (overplated boards). This type of overplating is commonly experienced in the electronic industry with poorly controlled baths or certain types of circuit patterns, and is particularly difficult to obtain clean stripping of resist, particularly from under the overhanging metal lines. These boards were subjected to media blasting under the conditions of Example 3, and complete resist removal was obtained. Under these conditions no direct contact of the media with the resist is possible, since the media particles are too large to fit between the metal lines and the edges of the resist are protected by the overhanging metal lines, yet the stripping was completely clean.

EXAMPLE 6

A board prepared as in Example 5, except etched instead of plated, was subjected to media blasting as in Example 3, with a angle orientation of 90 degrees of the blast stream to the plane of the board and a distance of 6 inches at 30 p.s.i. Rapid, clean stripping was obtained, with no significant distortion of the fine copper lines.

A plated sample prepared as in Example 5 was subjected to these blast conditions, and clean stripping was obtained. No difference in rate was seen whatever the x-y orientation of the board within the same plane as the blast stream traversed the board.

EXAMPLE 7

A board prepared as in Example 5, except etched instead of plated, was subjected to media blasting as in Example 3, with a angle orientation of 45 degrees of the blast stream to the plane of the board and a distance of 6 inches at 30 p.s.i. Rapid, clean stripping was obtained, but some distortion of the fine copper lines was seen. A plated sample prepared as in Example 5 was subjected to these blast conditions, but a longer time was required to cleanly strip the resist from between the lines when the lines were in some x-y orientations in the board plane as the blast stream traversed the board.

EXAMPLE 8

A board was prepared by electrodepositing a photosensitive coating onto a copper clad fiberglass epoxy G-10 laminate, exposing to a pattern, developing, and etching. This board was exposed to blast stripping by the method of Example 3, and rapid, clean removal of the etch resist was obtained. This electrodeposited resist is particularly difficult to remove rapidly with chemical strippers.

EXAMPLE 9

A photopolymerizable soldermask is applied to a completed circuit board having raised electronic circuitry, is imagewise exposed to actinic radiation, and developed using the process as described in Example 1 of Lau et al., U.S. Pat. No. 4,698,294. Before any post-development curing steps were carried out the photohardened soldermask image is removed by subjecting it to media blasting according to the method of Example 3. Removal is somewhat slower than that of the primary imaging resists of the previous examples, but complete removal is effected without damage to the substrate epoxy surface and without damaging even very fine-line features such as 0.050 mm lines between pads.

EXAMPLE 10

Boards prepared as in Example 5 were subjected to slurry blasting in the following manner: a 10 weight percent slurry of media as described in Example 3 in water was prepared and directed over the test panels through a nozzle at water pressures of 30–40 psi. To further accelerate the droplets of slurry, air at pressures of 50 to 100 psi was co-directed at the board through an annular opening around the water nozzle. Stripping of the resist was slower than the case in which air alone was the propelling medium, but completely clean stripping of the resist was obtained. The cushioning effect of the water also appeared to prevent damage to fine circuit lines, and minimized the surface texturing of the metal surfaces on the board. No static buildup or discharge was observed during this process.

What is claimed is:

1. A method of resist removal from a processed printed circuit substrate comprising the steps of:
   a) forming a resist image on a substrate, whereby portions of the substrate on its surface are protected by the resist,
   b) modifying the substrate unprotected by the resist image by removing material from the substrate or depositing material on the surface of the substrate in formation of a processed printed circuit substrate, and
   c) removing the resist by projecting media particles having a Moh hardness in a range from 2.0 to 4.0 onto substrate to uncover unmodified substrate areas.

2. The method of claim 1 wherein the media particles are solid polymeric particles.

3. The method of claim 1 wherein the media particles are projected to produce a substantially continuous media flow having a pressure of not greater than 60 pounds per square inch.

4. The method of claim 3 wherein the pressure is about 15 to 30 pounds per square inch.

5. The method of claim 1 wherein the media particles are projected to produce a substantially continuous flow which is substantially perpendicular to the processed printed circuit substrate.

6. The method of claim 1 wherein the media particles are projected to produce a substantially continuous flow of an angle from about 80 to about 90 degrees to the substrate.

7. The method of claim 1 wherein the media particles have a U.S. standard sieve size between about 12 and about 200.

8. The method of claim 7 wherein the media particles have a U.S. standard sieve size of 60–80 or greater.

9. The method of claim 2 wherein the polymeric, media particles are a thermoplastic plastic.

10. The method of claim 9 wherein the thermoplastic plastic is an acrylic polymer or interpolymer.

11. The method of claim 9 wherein the projected polymeric, media particles are reused.

12. The method of claim 1 wherein the media particles are projected by a gas.

13. The method of claim 1 wherein the media particles are projected by a liquid.

14. The method of claim 1 wherein the media particles are projected by a mechanical means.

15. The method of claim 1 wherein the resist is removed without a prior resist baking step.

16. The method of claim 1 wherein the resist is removed after a resist baking step.

17. A method of removing photoresist from a printed circuit substrate having thereon conductive circuitry and dielectric areas, comprising the steps of:
   a) applying a photoresist to a substrate,
   b) exposing the applied photoresist to actinic radiation to form a hardened image on the substrate, whereby portions of the substrate are protected by the resist,
   c) modifying the substrate unprotected by the resist image by removing material from the substrate or depositing material on the surface of the substrate in formation of a processed printed circuit substrate, and
   d) removing the resist by projecting media particles having a Moh hardness in a range from 2.0 to 4.0 onto the substrate to remove the resist image and uncover unmodified substrate areas.

18. A method of removing defective, permanent photoresist from a printed circuit substrate having thereon conductive circuitry and dielectric areas, comprising the steps of:
   a) applying a permanent photoresist to the printed circuit substrate,
   b) exposing the applied photoresist to actinic radiation to form a hardened, permanent photoresist image, and
   c) removing the resist by projecting media particles having a Moh hardness in a range from 2.0 to 4.0 onto the substrate to uncover the conductive circuitry and dielectric areas.

19. The method of claim 13 wherein the media particles are solid polymeric particles.

20. The method of claim 13 wherein the conductive circuitry is raised above the dielectric areas.

* * * * *